United States Patent
Peschke et al.

(10) Patent No.: US 10,816,631 B2
(45) Date of Patent: Oct. 27, 2020

(54) PROBE CORRECTION SYSTEM AND METHOD

(71) Applicant: Rohde & Schwarz GmbH & Co. KG, Munich (DE)

(72) Inventors: Martin Peschke, Vaterstetten (DE); Benedikt Lippert, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 128 days.

(21) Appl. No.: 15/940,369

(22) Filed: Mar. 29, 2018

(65) Prior Publication Data
US 2019/0302214 A1 Oct. 3, 2019

(51) Int. Cl.
*G01R 35/00* (2006.01)
(52) U.S. Cl.
CPC .................................. *G01R 35/005* (2013.01)
(58) Field of Classification Search
CPC . G01R 31/11; G01R 1/06772; G01R 1/07307
See application file for complete search history.

(56) References Cited

U.S. PATENT DOCUMENTS

| 7,994,801 B2 | 8/2011 | Hagerup et al. |
| 9,618,599 B2 | 4/2017 | Dascher |
| 2005/0017708 A1* | 1/2005 | Miller ..................... G01R 35/00 324/750.01 |
| 2008/0048673 A1* | 2/2008 | Tan ....................... G01R 35/005 324/601 |
| 2008/0278176 A1* | 11/2008 | Hagerup .............. G01R 35/005 324/601 |
| 2010/0233964 A1* | 9/2010 | Koeppl .............. G01R 1/06772 455/67.11 |
| 2010/0277190 A1* | 11/2010 | Reichel .............. G01R 1/06766 324/754.11 |
| 2013/0076372 A1* | 3/2013 | Dascher ................. G01R 35/00 324/601 |

* cited by examiner

*Primary Examiner* — Alvaro E Fortich
(74) *Attorney, Agent, or Firm* — Ditthavong & Steiner, P.C.

(57) ABSTRACT

A probe correction system is provided. Said probe correction system comprises a time domain reflectometry signal source comprising at least one output port. A test fixture comprises at least one probing point and at least one input port configured to be connectable to the at least one output port. A measurement device comprises at least one input channel. A probe under test comprises at least one probe input port configured to be connectable to the at least one probing point of the test fixture and at least one probe output port configured to be connectable to at least one input channel of the measurement device.

16 Claims, 3 Drawing Sheets

PROBE CORRECTION SYSTEM AND METHOD

TECHNICAL FIELD

The invention relates to a probe correction system and a probe correction method, wherein a test fixture has especially not to be connected to the respective measurement device in order to ensure measurement efficiency and accuracy.

BACKGROUND ART

Generally, in times of an increasing number of applications comprising electrical circuitry providing broadband signals, there is a growing need of a probe correction system and a corresponding probe correction method especially in order to verify the proper functioning of said applications in an efficient and accurate manner.

U.S. Pat. No. 9,618,599 B2 relates to a method for characterizing and correcting a response of a voltage probe. The method includes measuring an output of the voltage probe and a first output of a through, in response to an input signal applied to the through, with the voltage probe connected to a probe point of the through; measuring a second output of the through in response to the input signal, with the voltage probe disconnected from the probe point; and characterizing the response of the voltage probe using the measured output of the voltage probe and at least one of the measured first output and the measured second output of the through. As can be seen, the respective test fixture has to be connected to the measurement device, which leads to less efficiency and accuracy because especially in the case that all channels of the measurement device are in use, it is not possible to calibrate or re-calibrate the probe.

Accordingly, there is a need to provide a probe correction system and a probe correction method, wherein a test fixture has especially not to be connected to the respective measurement device in order to ensure measurement efficiency and accuracy.

SUMMARY OF THE INVENTION

According to a first aspect of the invention, a probe correction system is provided. Said probe correction system comprises a time domain reflectometry signal source comprising at least one output port, a test fixture comprising at least one probing point and at least one input port configured to be connectable to the at least one output port, a measurement device comprising at least one input channel, and a probe under test comprising at least one probe input port configured to be connectable to the at least one probing point of the test fixture and at least one probe output port configured to be connectable to at least one input channel of the measurement device. Advantageously, measurement efficiency and accuracy can be ensured.

According to a first preferred implementation form of the first aspect, the time domain reflectometry signal source further comprises a measuring unit configured to measure a voltage or current at the at least one output port over time. Advantageously, said voltage may be a time-domain representation of the respective response.

According to a further preferred implementation form of the first aspect, with respect to the at least one input channel of the measurement device, the measuring unit is further configured to determine an input loading and/or a step response by acquiring at least one incident signal to the test fixture especially generated by the time domain reflectometry signal source. Advantageously, accuracy can be increased.

According to a further preferred implementation form of the first aspect, the measuring unit is further configured to acquire at least one reflection signal especially reflected by the probe under test in response to the at least one incident signal. Advantageously, accuracy can be further increased.

According to a further preferred implementation form of the first aspect, with the aid of the at least one input channel, the measurement device is configured to acquire at least one transmission signal especially transmitted by the probe under test in response to the at least one incident signal. Advantageously, errors can be reduced.

According to a further preferred implementation form of the first aspect, at least one of the time domain reflectometry signal source and/or the at least one output port and/or the test fixture and/or the at least one probing point and/or the at least one input port and/or the measurement device and/or the at least one input channel and/or the probe under test and/or the at least one probe input port and/or the at least one probe output port and/or the measuring unit comprises at least one single-ended port or differential port. Advantageously, in this manner, both single-ended and differential signals can be used.

According to a further preferred implementation form of the first aspect, the time domain reflectometry signal source is configured to generate at least one of the following signal forms or any combination thereof at its at least one output port: step, pulse, impulse, swept sine. Additionally or alternatively, the test fixture comprises at least one waveguide comprising at least one waveguide input port and at least one waveguide output port. Advantageously, flexibility and accuracy can be increased.

According to a further preferred implementation form of the first aspect, the at least one waveguide output port is terminated. Advantageously, efficiency can be increased due to a lower complexity, whereas errors can be reduced.

According to a further preferred implementation form of the first aspect, the time domain reflectometry signal source and/or the measuring unit are comprised by a housing of the measuring device. Advantageously, this allows for a very clear measurement setup.

According to a further preferred implementation form of the first aspect, the measuring unit comprises at least a second input channel of the at least one input channel of the measurement device. Advantageously, probe correction can be performed with a higher accuracy or in parallel.

According to a further preferred implementation form of the first aspect, at least one of the time domain reflectometry signal source, the measurement device, or the measuring unit is configured to generate at least one frequency representation of at least one of the following signals: at least one incident signal to the test fixture especially generated by the time domain reflectometry signal source, at least one reflection signal especially reflected by the probe under test in response to the at least one incident signal, at least one transmission signal especially transmitted by the probe under test in response to the at least one incident signal, or any combination thereof. Advantageously, accuracy can be increased further.

According to a further preferred implementation form of the first aspect, at least one of the time domain reflectometry signal source, the measurement device, or the measuring unit is configured to generate at least one frequency representation of a probe loading of the probe under test. Advantageously, corrections with special respect to the probe loading can be performed.

According to a further preferred implementation form of the first aspect, at least one of the time domain reflectometry signal source, the measurement device, or the measuring unit is configured to generate at least one frequency representation of a probe response of the probe under test. Advantageously, corrections with special respect to the probe response can be performed.

According to a further preferred implementation form of the first aspect, at least one of the time domain reflectometry signal source, the measurement device, or the measuring unit is configured to generate at least one frequency representation of a probe response including a probe loading of the probe under test. Advantageously, corrections with special respect to the probe response including the probe loading can be performed.

According to a further preferred implementation form of the first aspect, at least one of the time domain reflectometry signal source, the measurement device, or the measuring unit is configured to calibrate a probe correction system, especially the probe correction system, on the basis of a first correction signal being captured with the aid of the at least one input channel of the measurement device, wherein at least one test output port of the test fixture is especially connected to the at least one input channel of the measurement device. Advantageously, calibration of the probe can be performed.

According to a further preferred implementation form of the first aspect, at least one of the time domain reflectometry signal source, the measurement device, or the measuring unit is configured to calibrate the probe correction system on the basis of a second correction signal being captured with the aid of the time domain reflectometry signal source. Advantageously, accuracy of calibration can be increased further.

According to a further preferred implementation form of the first aspect, the second correction signal comprises at least one reflection of the test fixture, wherein the test fixture is especially unloaded. Advantageously, reflections are taken into consideration.

According to a second aspect of the invention, a probe correction method is provided. Said probe correction method comprises the steps of connecting at least one probe input port of a probe under test to at least one probing point of a test fixture, connecting at least one probe output port of the probe under test to at least one input channel of a measurement device, and measuring a voltage at at least one output port of a time domain reflectometry signal source over time with the aid of a measuring unit of the time domain reflectometry signal source. Advantageously, measurement efficiency and accuracy can be ensured. Further advantageously, said voltage may be a time-domain representation of the respective response.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
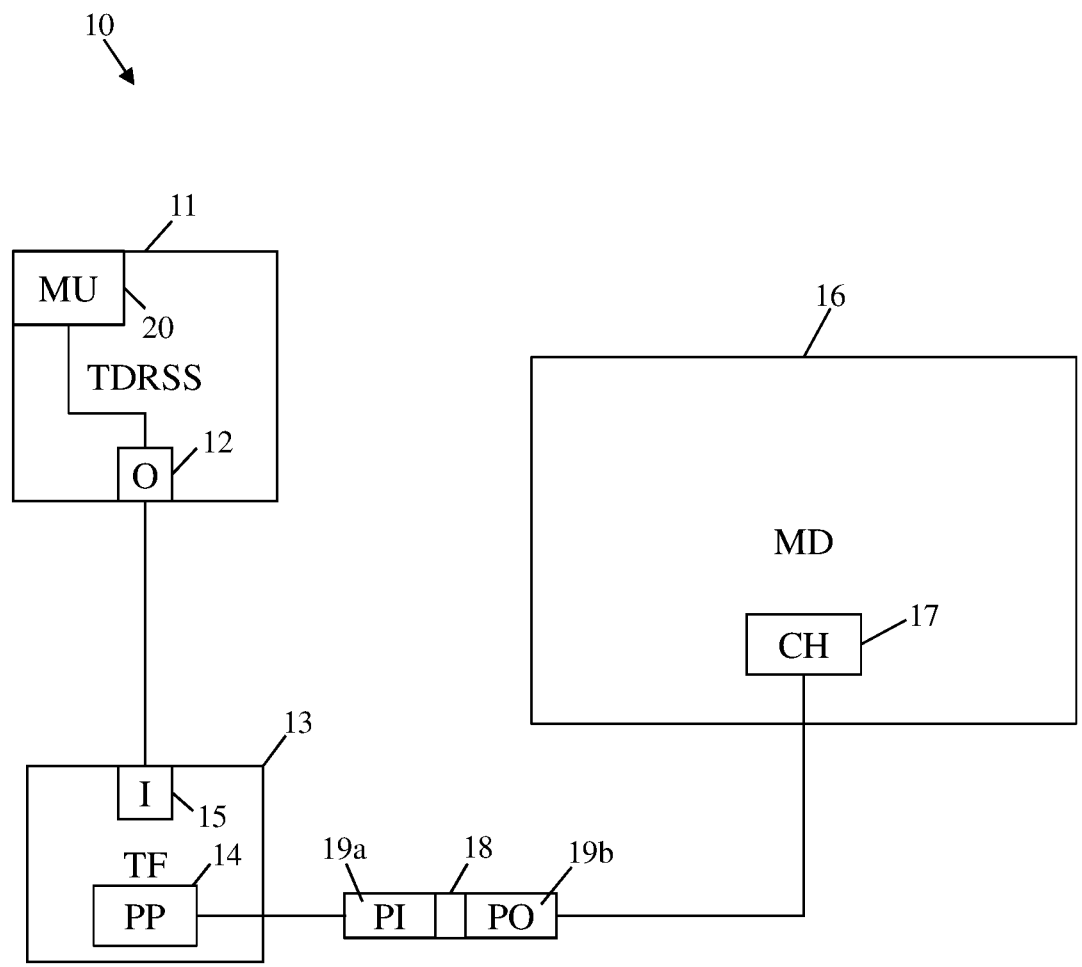
FIG. 1 shows an exemplary embodiment of the first aspect of the invention.

Firstly, FIG. 1 illustrates an exemplary embodiment of an inventive probe correction system 10. Said system 10 comprises a time domain reflectometry signal source 11 comprising an output port 12, a test fixture 13 comprising a probing point 14 and an input port 15 configured to be connectable to the output port 12, a measurement device 16 comprising an input channel 17, and a probe under test 18 comprising a probe input port 19a configured to be connectable to the probing point 14 of the test fixture and a probe output port 19b configured to be connectable to the input channel 17 of the measurement device 16.

In this context, the time domain reflectometry signal source 11 further comprises a measuring unit 20 configured to measure a voltage or current at the output port 12 over time.

Furthermore, with respect to the input channel 17 of the measurement device 16, the measuring unit 20 may further be configured to determine an input loading and/or a step response by acquiring at least one incident signal to the test fixture 13 especially generated by the time domain reflectometry signal source 11.

In addition to this, the measuring unit 20 may further be configured to acquire at least one reflection signal especially reflected by the probe under test 18 in response to the at least one incident signal.

Moreover, with the aid of the input channel 17, the measurement device 16 may further be configured to acquire at least one transmission signal especially transmitted by the probe under test 18 in response to the at least one incident signal.

It might be particularly advantageous if at least one of the time domain reflectometry signal source 11 and/or the output port 12 and/or the test fixture 13 and/or the probing point 14 and/or the input port 15 and/or the measurement device 16 and/or the input channel 17 and/or the probe under test 18 and/or the probe input 19a port and/or the probe output port 19b and/or the measuring unit comprises at least one single-ended port or differential port.

Additionally, the time domain reflectometry signal source 11 may be configured to generate at least one of the following signal forms or any combination thereof at its output port 12: step, pulse, impulse, swept sine. In addition to this or as an alternative, the test fixture 13 may comprise at least one waveguide comprising at least one waveguide input port and at least one waveguide output port. In this context, the at least one waveguide output port is terminated.

Furthermore, it is noted that the time domain reflectometry signal source 11 and/or the measuring unit may be comprised by a housing of the measuring device 16. Additionally or alternatively, the measuring unit 16 may comprises at least one further input channel.

Moreover, at least one of the time domain reflectometry signal source 11, the measurement device 16, or the measuring unit 20 may be configured to generate at least one frequency representation of at least one of the following signals: at least one incident signal to the test fixture 13 especially generated by the time domain reflectometry signal source 11, at least one reflection signal especially reflected by the probe under test 18 in response to the at least one incident signal, at least one transmission signal especially transmitted by the probe under test 18 in response to the at least one incident signal, or any combination thereof.

In addition to this or as an alternative, at least one of the time domain reflectometry signal source 11, the measurement device 16, or the measuring unit 20 may further be configured to generate at least one frequency representation of a probe loading of the probe under test 18.

Additionally or alternatively, at least one of the time domain reflectometry signal source 11, the measurement device 16, or the measuring unit 20 may further be configured to generate at least one frequency representation of a probe response of the probe under test 18.

Furthermore, at least one of the time domain reflectometry signal source 11, the measurement device 16, or the measuring unit 20 may further be configured to calibrate a probe correction system, especially the probe correction system 10, on the basis of a first correction signal being captured with the aid of the input channel 17 of the measurement device 16, wherein a test output port of the test fixture 13 is especially connected to the input channel 17 of the measurement device 16.

In addition to this or as an alternative, at least one of the time domain reflectometry signal source 11, the measurement device 16, or the measuring unit 20 may be configured to calibrate the probe correction system 10 on the basis of a second correction signal being captured with the aid of the time domain reflectometry signal source 11. In this context, said second correction signal may comprise at least one reflection of the test fixture 13, wherein the test fixture 13 is especially unloaded.

Figure 2:
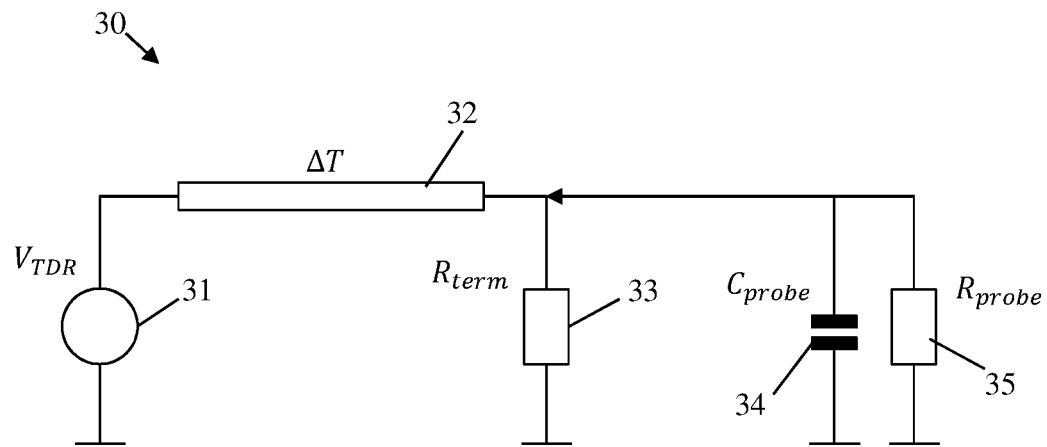
FIG. 2 shows an exemplary probing arrangement.

Now, with respect to FIG. 2, an exemplary probing arrangement is depicted. Strictly speaking, FIG. 2 shows an equivalent circuit diagram 30 of an exemplary probing arrangement.

As it can be seen, a voltage source 31 provides a time domain reflectometry voltage $V_{TDR}$. Said time domain reflectometry voltage $V_{TDR}$ may especially be provided at the output port 12 of the domain reflectometry signal source 11.

In addition to this, as already mentioned above, the test fixture 13 may comprise at least one waveguide comprising at least one waveguide input port and at least one waveguide output port. In accordance with FIG. 2, the time domain reflectometry voltage $V_{TDR}$ is passed to an input port of a waveguide 32 causing the transit time $\Delta T$.

In this context, also as already mentioned above, the output port of the waveguide 32 is terminated with a terminating resistor 33 comprising the resistance value $R_{term}$, preferably 50 ohms. Additionally, the output port of the waveguide 32 is connected to the probe input port of the probe under test, wherein the probe under test especially comprises a probe capacitance 34 comprising the capacitance value $C_{probe}$, preferably 1 picofarad, and a probe resistance 35 comprising the resistance value $R_{probe}$, preferably about 1 Megaohm.

Figure 3:
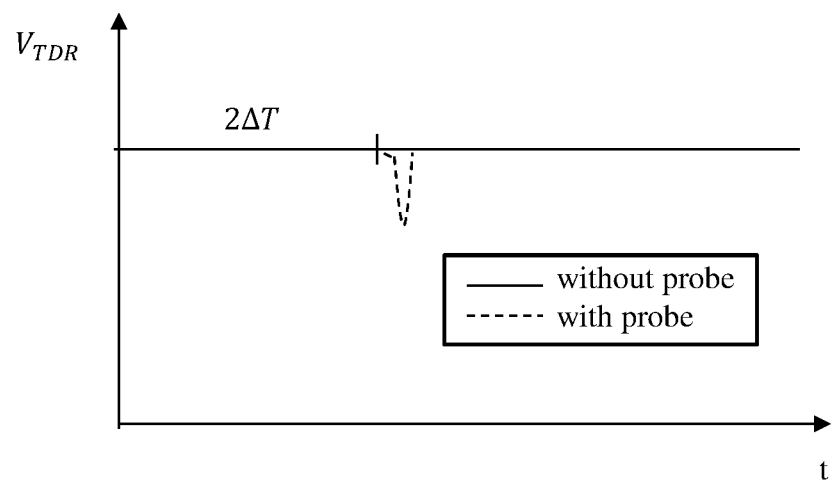
FIG. 3 shows an exemplary diagram of time domain reflectometry voltage as a function of time with and without probe.

Moreover, FIG. 3 illustrates the course of the time domain reflectometry voltage curve over time. On the one hand, with the aid of the drawn through line, FIG. 3 shows the respective voltage curve in the case that no probe is connected to output port of the waveguide 32, and on the other hand, with the aid of the dotted line, FIG. 3 depicts the respective voltage curve for the case that a probe is connected to the output port of the waveguide 32.

Figure 4:
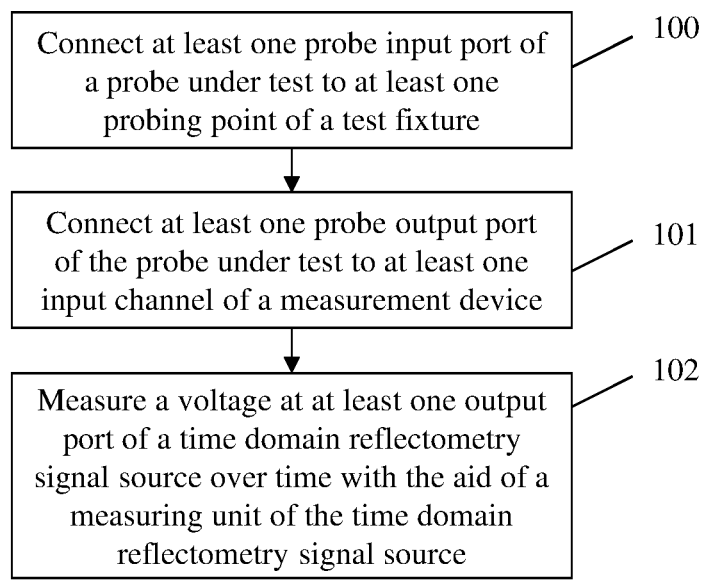
FIG. 4 shows a flow chart of an exemplary embodiment of the second aspect of the invention.

Finally, FIG. 4 shows a flow chart of an exemplary embodiment of the inventive probe correction method. In a first step 100, at least one probe input port of a probe under test is connected to at least one probing point of a test fixture. Then, in a second step 101, at least one probe output port of the probe under test is connected to at least one input channel of a measurement device. Furthermore, in a third step 102, a voltage is measured at at least one output port of a time domain reflectometry signal source over time with the aid of a measuring unit of the time domain reflectometry signal source.

In this context, with respect to the at least one input channel of the measurement device, the method may further comprise the step of determining an input loading and/or a step response by acquiring at least one incident signal to the test fixture especially generated by the time domain reflectometry signal source with the aid of the measuring unit.

Moreover, the method may further comprise the step of acquiring at least one reflection signal especially reflected by the probe under test in response to the at least one incident signal with the aid of the measuring unit.

In addition to this, the probe correction method may further comprise the step of acquiring at least one transmission signal especially transmitted by the probe under test in response to the at least one incident signal with the aid of the at least one input channel.

Furthermore, it is noted that at least one of the time domain reflectometry signal source and/or the at least one output port and/or the test fixture and/or the at least one probing point and/or the at least one input port and/or the measurement device and/or the at least one input channel and/or the probe under test and/or the at least one probe input port and/or the at least one probe output port and/or the measuring unit may comprise at least one single-ended port or differential port.

It may be further advantageous if the method comprises the step of generating at least one of the following signal forms or any combination thereof at its at least one output port with the aid of the time domain reflectometry signal source: step, pulse, impulse, swept sine. Additionally or alternatively, the test fixture may comprise at least one waveguide comprising at least one waveguide input port and at least one waveguide output port. In this context, the at least one waveguide output port may advantageously be terminated.

In addition to this, it is noted that the time domain reflectometry signal source and/or the measuring unit may be comprised by a housing of the measuring device. Moreover, the measuring unit may advantageously comprise at least a second input channel of the at least one input channel of the measurement device.

Furthermore, the probe correction method may additionally or alternatively comprise the step of generating at least one frequency representation of at least one of the following signals with the aid of at least one of the time domain reflectometry signal source, the measurement device, or the measuring unit: at least one incident signal to the test fixture especially generated by the time domain reflectometry signal source, at least one reflection signal especially reflected by the probe under test in response to the at least one incident signal, at least one transmission signal especially transmitted by the probe under test in response to the at least one incident signal, or any combination thereof.

In this context, the probe correction method may further comprise the step of generating at least one frequency representation of a probe loading of the probe under test with the aid of at least one of the time domain reflectometry signal source, the measurement device, or the measuring unit.

Additionally, the method may further comprise the step of generating at least one frequency representation of a probe response of the probe under test with the aid of at least one of the time domain reflectometry signal source, the measurement device, or the measuring unit.

In addition to this or as an alternative, the probe correction method may comprise the step of generating at least one frequency representation of a probe response including a probe loading of the probe under test with the aid of at least one of the time domain reflectometry signal source, the measurement device, or the measuring unit.

Moreover, the probe correction method may further comprise the step of calibrating with the aid of at least one of the time domain reflectometry signal source, the measurement device, or the measuring unit, a probe correction system, especially the probe correction system, on the basis of a first correction signal being captured with the aid of the at least one input channel of the measurement device, wherein at least one test output port of the test fixture is especially connected to the at least one input channel of the measurement device.

In this context, the method may further comprise the step of calibrating with the aid of at least one of the time domain reflectometry signal source, the measurement device, or the measuring, the probe correction system on the basis of a second correction signal being captured with the aid of the time domain reflectometry signal source.

In addition to this, it is noted that the second correction signal may comprise at least one reflection of the test fixture, wherein the test fixture is especially unloaded.

While various embodiments of the present invention have been described above, it should be understood that they have been presented by way of example only, and not limitation. Numerous changes to the disclosed embodiments can be made in accordance with the disclosure herein without departing from the spirit or scope of the invention. For example, a current may be measured instead of a voltage. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A probe correction system comprising:
a time domain reflectometry signal source comprising at least one output port,
a test fixture comprising at least one probing point and at least one input port configured to be connectable to the at least one output port,
a measurement device comprising at least one input channel, and
a probe under test comprising at least one probe input port configured to be connectable to the at least one probing point of the test fixture and at least one probe output port configured to be connectable to at least one input channel of the measurement device,
wherein the time domain reflectometry signal source further comprises a measuring unit configured to measure a voltage or current at the at least one output port over time,
wherein at least one of the time domain reflectometry signal source, the measurement device, or the measuring unit is configured to generate at least one frequency representation of a probe response of the probe under test, and
wherein a time domain reflectometry voltage is passed to an input port of a waveguide causing a transit time.

2. The probe correction system according to claim 1, wherein with respect to the at least one input channel of the measurement device, the measuring unit is further configured to determine an input loading and/or a step response by acquiring at least one incident signal to the test fixture generated by the time domain reflectometry signal source.

3. The probe correction system according to claim 2, wherein the measuring unit is further configured to acquire at least one reflection signal reflected by the probe under test in response to the at least one incident signal.

4. The probe correction system according to claim 2, wherein with the aid of the at least one input channel, the measurement device is configured to acquire at least one transmission signal transmitted by the probe under test in response to the at least one incident signal.

5. The probe correction system according to claim 1, wherein at least one of the time domain reflectometry signal source and/or the at least one output port and/or the test fixture and/or the at least one probing point and/or the at least one input port and/or the measurement device and/or the at least one input channel and/or the probe under test and/or the at least one probe input port and/or the at least one probe output port and/or the measuring unit comprises at least one single-ended port or differential port.

6. The probe correction system according to claim 1, wherein the time domain reflectometry signal source is configured to generate at least one of the following signal forms or any combination thereof at its at least one output port: step, pulse, impulse, swept sine, and/or wherein the test fixture comprises the at least one waveguide comprising the at least one waveguide input port and at least one waveguide output port.

7. The probe correction system according to claim 6, wherein the at least one waveguide output port is terminated.

8. The probe correction system according to claim 1, wherein the time domain reflectometry signal source and/or the measuring unit are comprised by a housing of the measuring device.

9. The probe correction system according to claim 1, wherein the measuring unit comprises at least a second input channel of the at least one input channel of the measurement device.

10. The probe correction system according to claim 1, wherein at least one of the time domain reflectometry signal source, the measurement device, or the measuring unit is configured to generate at least one frequency representation of at least one of the following signals: at least one incident signal to the test fixture generated by the time domain reflectometry signal source, at least one reflection signal reflected by the probe under test in response to the at least one incident signal, at least one transmission signal transmitted by the probe under test in response to the at least one incident signal, or any combination thereof.

11. The probe correction system according to claim 1, wherein at least one of the time domain reflectometry signal source, the measurement device, or the measuring unit is configured to generate at least one frequency representation of a probe loading of the probe under test.

12. The probe correction system according to claim 11, wherein at least one of the time domain reflectometry signal source, the measurement device, or the measuring unit is configured to generate at least one frequency representation of the probe response of the probe under test.

13. The probe correction system according to claim 1, wherein at least one of the time domain reflectometry signal source, the measurement device, or the measuring unit is configured to calibrate the probe correction system, the probe correction system, on the basis of a first correction signal being captured with the aid of the at least one input channel of the measurement device, wherein at least one test output port of the test fixture is connected to the at least one input channel of the measurement device.

14. The probe correction system according to claim 13, wherein at least one of the time domain reflectometry signal source, the measurement device, or the measuring unit is configured to calibrate the probe correction system on the basis of a second correction signal being captured with the aid of the time domain reflectometry signal source.

15. The probe correction system according to claim 14, wherein the second correction signal comprises at least one reflection of the test fixture, wherein the test fixture is unloaded.

16. A probe correction method comprising the steps of:
connecting at least one probe input port of a probe under test to at least one probing point of a test fixture,
connecting at least one probe output port of the probe under test to at least one input channel of a measurement device,
measuring a voltage or a current at at least one output port of a time domain reflectometry signal source over time with the aid of a measuring unit of the time domain reflectometry signal source,
generating at least one frequency representation of a probe response of the probe under test with the aid of at least one of the time domain reflectometry signal source, the measurement device, or the measuring unit; and
passing a time domain reflectometry voltage to an input port of a waveguide causing a transit time.

* * * * *